(12) United States Patent
Chadda et al.

(10) Patent No.: US 6,464,855 B1
(45) Date of Patent: Oct. 15, 2002

(54) METHOD AND APPARATUS FOR ELECTROCHEMICAL PLANARIZATION OF A WORKPIECE

(75) Inventors: Saket Chadda, Phoenix, AZ (US); Chris Barns, Portland, OR (US)

(73) Assignee: SpeedFam-IPEC Corporation, Phoenix, AZ (US)

(*) Notice: Subject to any disclaimer, the term of this patent is extended or adjusted under 35 U.S.C. 154(b) by 50 days.

(21) Appl. No.: 09/679,473

(22) Filed: Oct. 4, 2000

(51) Int. Cl.[7] ............................... C25F 3/16; C25F 7/00; C25D 17/00
(52) U.S. Cl. ..................... 205/662; 205/663; 205/686; 204/224 M; 204/212; 204/217
(58) Field of Search ................... 205/662, 663, 205/686; 204/224 M, 217

(56) References Cited

U.S. PATENT DOCUMENTS

| | | | |
|---|---|---|---|
| 3,959,089 A | * 5/1976 | Watts | ..................... 204/217 X |
| 5,256,565 A | 10/1993 | Bernhardt et al. | |
| 5,567,300 A | 10/1996 | Datta et al. | |
| 5,863,412 A | 1/1999 | Ichinose et al. | |
| 5,993,637 A | 11/1999 | Hisamatsu et al. | |
| 6,017,437 A | 1/2000 | Ting et al. | |
| 6,056,869 A | 5/2000 | Uzoh | |
| 6,077,412 A | 6/2000 | Ting et al. | |
| 6,171,467 B1 | * 1/2001 | Weihs et al. | ............. 204/224 R |
| 6,176,992 B1 | 1/2001 | Talieh | |
| 6,299,741 B1 | * 10/2001 | Sun et al. | ............... 204/224 M |
| 6,328,872 B1 | * 12/2001 | Talieh et al. | ................. 205/206 |

FOREIGN PATENT DOCUMENTS

| | | |
|---|---|---|
| GB | 2 069 531 | 8/1981 |
| WO | WO00/26443 | 5/2000 |

OTHER PUBLICATIONS

Robert J. Contolini, Anthony F. Bernhardt and Steven T. Mayer, *Electrochemical Planarization for Multilevel Metallization*, J. Electrochem. Soc., vol. 141, No. 9 (No Date).

* cited by examiner

*Primary Examiner*—Donald R. Valentine
(74) *Attorney, Agent, or Firm*—Snell & Wilmer, LLP

(57) ABSTRACT

An electrochemical planarization apparatus for planarizing a metallized surface on a workpiece includes a platen, a conductive element disposed adjacent the platen and a polishing surface disposed adjacent the conductive element. A workpiece carrier is configured to carry a workpiece and press the workpiece against the polishing surface while causing relative motion between the workpiece and the polishing surface. A voltage source is configured to effect an electric potential difference between the metallized surface on the workpiece and the conductive element so that an electric field is produced between the metallized surface and the conductive element. The apparatus further includes a solution application mechanism configured to supply an electrolytic solution to the polishing surface.

27 Claims, 5 Drawing Sheets

METHOD AND APPARATUS FOR ELECTROCHEMICAL PLANARIZATION OF A WORKPIECE

TECHNICAL FIELD

The present invention relates, generally, to systems for polishing or planarizing workpieces, such as semiconductor wafers. More particularly, it relates to an apparatus and method for electrochemical planarization of a wafer having a metallized surface.

BACKGROUND

The production of integrated circuits begins with the creation of high-quality semiconductor wafers. During the wafer fabrication process, the wafers may undergo multiple masking, etching, and dielectric and conductor deposition processes. In addition, metallization, which generally refers to the materials, methods and processes of wiring together or interconnecting the component parts of an integrated circuit located on the surface of a wafer, is critical to the operation of a semiconductor device. Typically, the "wiring" of an integrated circuit involves etching trenches, or "vias", in a planar dielectric (insulator) layer and filling the trenches with a metal.

In the past, the primary metallization material used in semiconductor fabrication was aluminum due to the leakage and adhesion problems experienced with the use of gold and the high contact resistance with silicon experienced with copper. Other metallization materials have included Ni, Ta, Ti, W, Ag, Cu/Al, TaN, TiN, CoWP, NiP and CoP. Over time, the semiconductor industry has slowly been moving to the use of copper for metallization due to the alloying and electromigration problems that are seen with aluminum. When copper is used as the filling, typically a barrier layer of another material is first deposited to line the trenches and vias to prevent the migration of copper into the dielectric layer. Barrier metals may be W, Ti, TiN, Ta, TaN, various alloys, and other refractory nitrides, which may be deposited by CVD, PFD, or electroless or electrolytic plating. To achieve good fill of the trenches and vias, extra metal is deposited in the process, such metal covering areas of the wafer above and outside the trenches and vias. After filling, planarization is typically conducted to remove the extra metal down to the dielectric surface. Planarization leaves the trenches and vias filled and results in a flat, polished surface.

Because of the high precision required in the production of integrated circuits, an extremely flat surface is generally needed on at least one side of the semiconductor wafer to ensure proper accuracy and performance of the microelectronic structures being created on the wafer surface. As the size of the integrated circuits continues to decrease and the density of microstructures on an integrated circuit increases, the need for precise wafer surfaces becomes more important. Therefore, between each processing step, it is usually necessary to polish or planarize the surface of the wafer to obtain the flattest surface possible.

For a discussion of chemical mechanical planarization (CMP) processes and apparatus, see, for example, Arai et al., U.S. Pat. No. 4,805,348, issued February 1989; Arai et al., U.S. Pat. No. 5,099,614, issued March 1992; Karlsrud et al., U.S. Pat. No. 5,329,732, issued July 1994; Karlsrud, U.S. Pat. No. 5,498,196, issued March 1996; and Karlsrud et al., U.S. Pat. No. 5,498,199, issued March 1996.

Typically, a CMP machine includes a wafer carrier configured to hold, rotate, and transport a wafer during the process of polishing or planarizing the wafer. During a planarization operation, a pressure applying element (e.g., a rigid plate, a bladder assembly, or the like), that may be integral to the wafer carrier, applies pressure such that the wafer engages a polishing surface with a desired amount of force. The carrier and the polishing surface are rotated, typically at different rotational velocities, to cause relative lateral motion between the polishing surface and the wafer and to promote uniform planarization.

In general, the polishing surface comprises a horizontal polishing pad that has an exposed abrasive surface of, for example, cerium oxide, aluminum oxide, fumed/precipitated silica or other particulate abrasives. Polishing pads can be formed of various materials, as is known in the art, and which are available commercially. Typically, the polishing pad may be blown polyurethane, such as the IC and GS series of polishing pads available from Rodel Products Corporation in Scottsdale, Ariz. The hardness and density of the polishing pad depend on the material that is to be polished.

While CMP tends to work very well for planarization if the correct slurry and process parameters are used, it may leave stresses in the worked workpiece, leading to subsequent cracking and shorting between metal layers. In addition, the semiconductor industry is increasing use of low k dielectrics, which tend to be fragile materials. CMP may result in shearing or crushing of these fragile layers. CMP also has a tendency to cause dishing into the center of wide metal features, such as trenches and vias, oxide erosion between metal features, and oxide loss of the dielectric.

Electrochemical planarization is an attractive alternative to CMP because it does not create stress in the workpiece and, consequently, does not reduce the integrity of the low k dielectric devices to the extent CMP may. Further, electrochemical planarization is less likely to cause dishing, oxide erosion and oxide loss of the dielectric layer.

Electrochemical planarization is based on electropolishing and electrochemical machining, that is, the removal of metal from a substrate by the combination of an electrochemical solution and electricity. FIG. 1 shows a conventional electroetching cell available in the prior art. A tank 2 holds a liquid electrolyte 4, an aqueous solution of a salt. Two electrodes, an anode 6 and a cathode 8, are wired to a voltage source, such as a battery 10. When the apparatus is electrified, metal atoms in the anode 6 are ionized by the electricity and go into the solution as ions. Depending on the chemistry of the metals and salt, the metal ions from anode 6 either plate the cathode 8, fall out as precipitate, or stay in solution.

When used for planarization of metal films on semiconductor wafers, conventional electrochemical planarization presents the disadvantage that the metal is not selectively removed from the wafer. FIG. 2 shows a dielectric layer 12 having trenches, or vias, and having a barrier metal layer 20 thereon. A metal layer 14 is deposited on the wafer over the barrier layer, filling the trenches. After being deposited on barrier layer 20, metal layer 14 may not be completely flat but, rather, may have areas of high topography 16 and low topography 18. With conventional electrochemical planarization, the metal layer is removed uniformly, so that the areas of high topography and low topography remain.

In planarization, however, "step-height reductions" is desired, that is, the selective removal of the metal layer at the high topography areas, followed by uniform removal of the metal layer. Step-height reduction should result in metal remaining only in the trenches and vias with a flat surface therein, as illustrated in FIG. 3.

Accordingly, there exists a need for an electrochemical planarization method and apparatus which accomplishes step-height reduction of metal layers on substrates, followed by uniform planarization of the metal layer.

SUMMARY OF THE INVENTION

These and other aspects of the present invention will become more apparent to those skilled in the art from the following non-limiting detailed description of preferred embodiments of the invention taken with reference to the accompanying figures.

In accordance with an exemplary embodiment of the present invention, an electrochemical planarization apparatus for planarizing a metallized surface on a workpiece includes a platen, a conductive element disposed adjacent the platen and a polishing surface disposed adjacent the conductive element. A workpiece carrier is configured to carry a workpiece and press the workpiece against the polishing surface while causing relative motion between the workpiece and the polishing surface. A voltage source is configured to effect an electric potential difference between the metallized surface of the workpiece and the conductive element. The apparatus further includes an electrolytic solution source and a solution application mechanism configured to supply an electrolytic solution from the electrolytic solution source to the polishing surface.

In accordance with a further embodiment of the present invention, a method of planarizing a metallized surface on a workpiece includes the steps of: providing a platen; providing a conductive element on the surface of the platen; providing a polishing surface on the surface of the conductive element; providing a workpiece carrier configured to carry a workpiece; pressing the workpiece against the polishing surface while causing relative motion between the workpiece and the polishing surface; establishing an electric potential difference between the metallized surface of workpiece and the conductive element; and supplying an electrolytic solution to the polishing surface.

BRIEF DESCRIPTION OF THE DRAWINGS

Exemplary embodiments of the present invention will hereafter be described in conjunction with the appended drawing figures, wherein like designations denote like elements, and.

DETAILED DESCRIPTION OF THE INVENTION

The following description is of exemplary embodiments only and is not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth.

Figure 4:
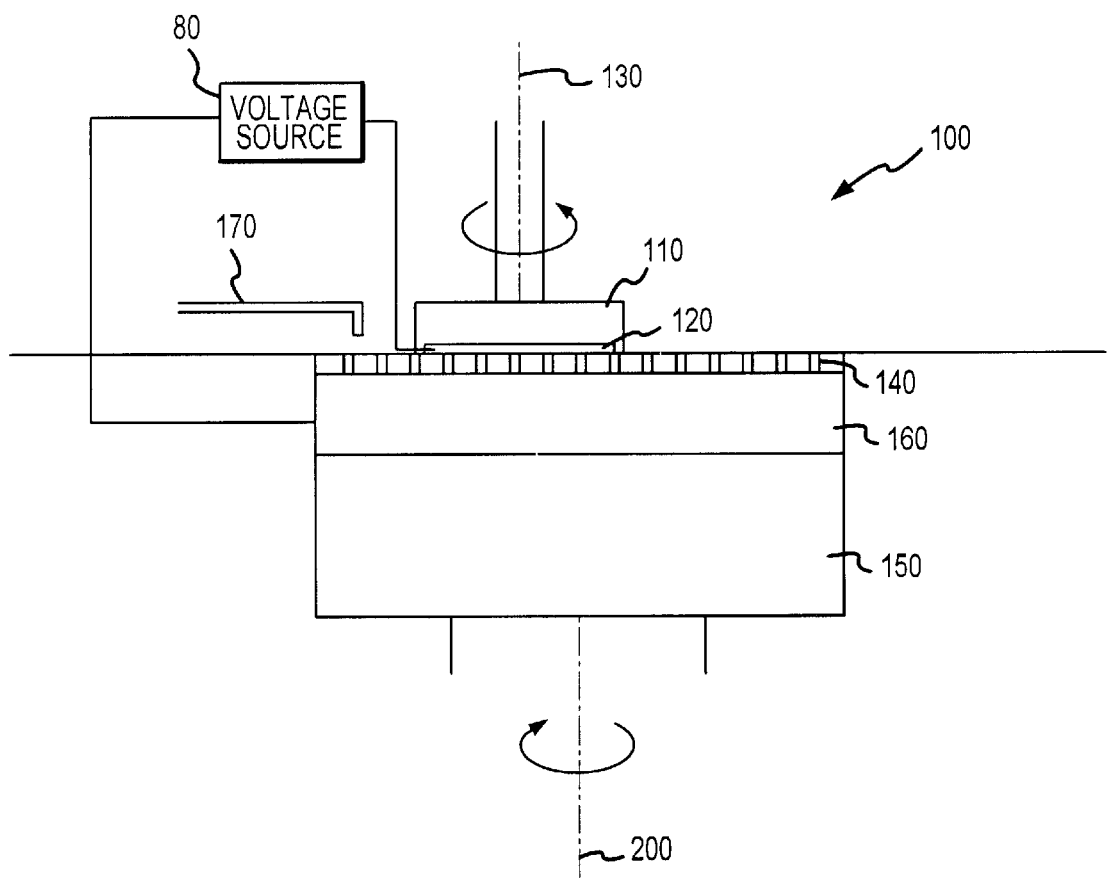
FIG. 4 is a schematic side view representation of an exemplary embodiment of an ECMP apparatus of the present invention.

A schematic representation of an exemplary embodiment of the electrochemical planarization (ECP) apparatus 100 of the present invention is shown in FIG. 4. As seen, a wafer carrier 110 holds a wafer 120 with a metallized surface that is to be planarized. The wafer carrier 110 preferably rotates about a vertical axis 130. A polishing pad 140 is mounted onto a polishing platen 150. Polishing platen 150 is connected to a driver or motor assembly (not shown) that is operative to rotate polishing platen 150 and polishing pad 140 about a vertical axis 200.

The ECP apparatus uses both electrochemical etching and chemical mechanical planarization of wafer 120. To effect electrochemical etching of wafer 120, platen 150 includes or has formed thereon a conductive layer 160. Conductive layer 160 may be made of metal, such as copper, or any other conductive material. An electric potential difference is effected between conductive layer 160 and the metallized surface of wafer 120 by a voltage source 180 which applies a positive charge to the surface of the wafer and a negative charge to conductive layer 160. An electrolytic planarizing solution may be applied by a conduit 170. Alternatively, it will be appreciated that the electrolytic planarizing solution may be supplied through platen 150 and polishing pad 140 through a manifold apparatus (not shown) or any suitable distribution device. The electrolytic planarizing solution may include such materials as ammonium phosphate, phosphoric acid, copper sulfate, sulfuric acid, chromic acid and/or additives, or may be a combination of such materials and a conventional CMP slurry. When the electric potential difference is effected between the metallized surface of wafer 120 and conductive layer 160, metal ions are liberated from wafer 120, thus resulting in deplating of the metal layer from the wafer.

During the application of the electric potential to ECP apparatus 100, wafer 120 is also subjected to chemical mechanical planarization. Wafer carrier 110 advances wafer 120 toward polishing pad 140 and applies pressure such that wafer 120 engages polishing pad 140 with a desired amount of force. Preferably, wafer carrier 110 applies a pressure of approximately 0.5 psi or less, although it may be appreciated that any suitable pressure which promotes planarization without interfering with the concurrent electrochemical etching process may be used. Wafer carrier 110, and wafer 120, rotate about axis 130 while platen 150 and polishing pad 140 rotate about axis 200. In addition, wafer carrier 110 and wafer 120 may oscillate relative to polishing pad 140.

The hardness and density of polishing pad 140 are selected based on the type of material to be planarized. Blown polyurethane pads, such as the IC and GS series of pads available from Rodel Products Corporation of Scottsdale, Ariz., may be advantageously utilized by the ECP system, although it will be appreciated that any suitable polishing pad may be used. Polishing pad 140 should be sufficiently thick to prevent wafer 120 from coming into direct contact with conductive layer 160. In addition, because conventional polishing pads are generally not conductive, polishing pad 140 is preferably uniformly perforated and/or porous so as to permit conduction between wafer 120 and conductive layer 160. The perforations and pores permit distribution of an electrochemical/electrolytic planarization solution and perform a "brushing" action on the wafer.

Figure 1:
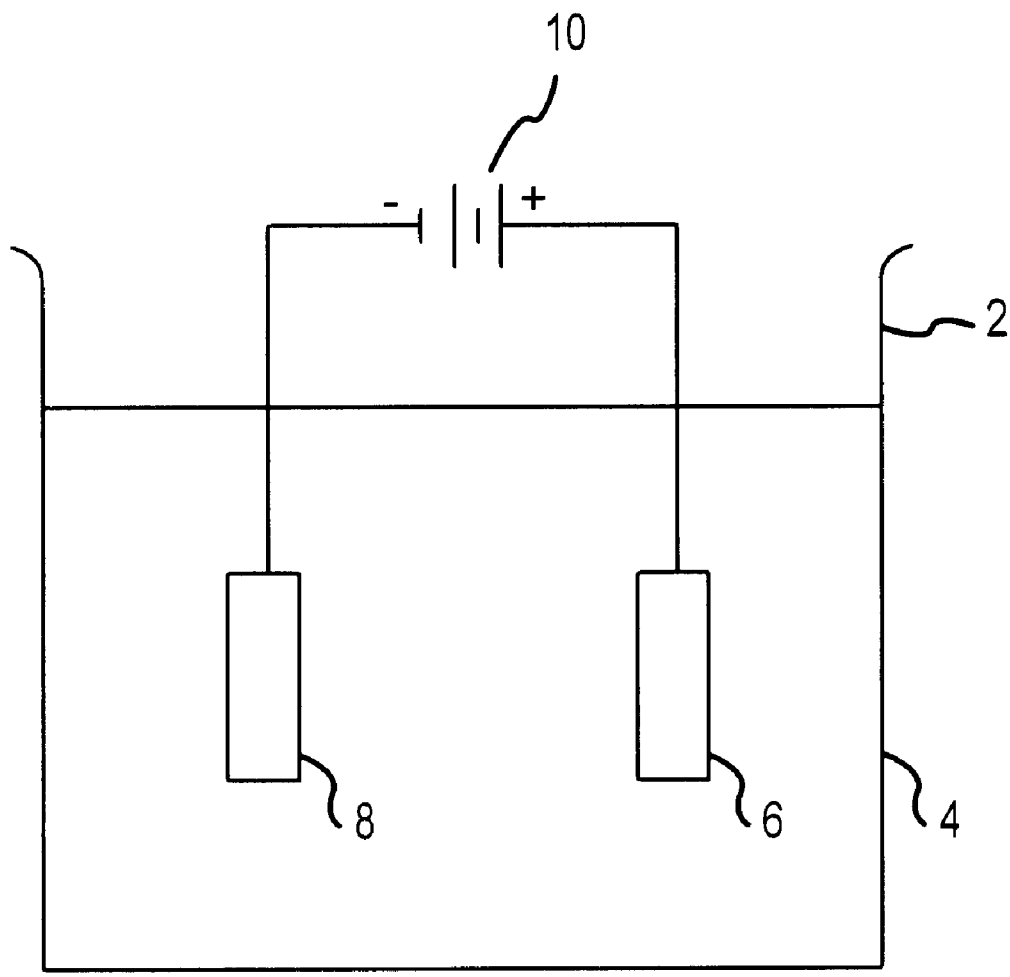
FIG. 1 is a schematic illustration of an electroetching cell of the prior art.
Figure 2:
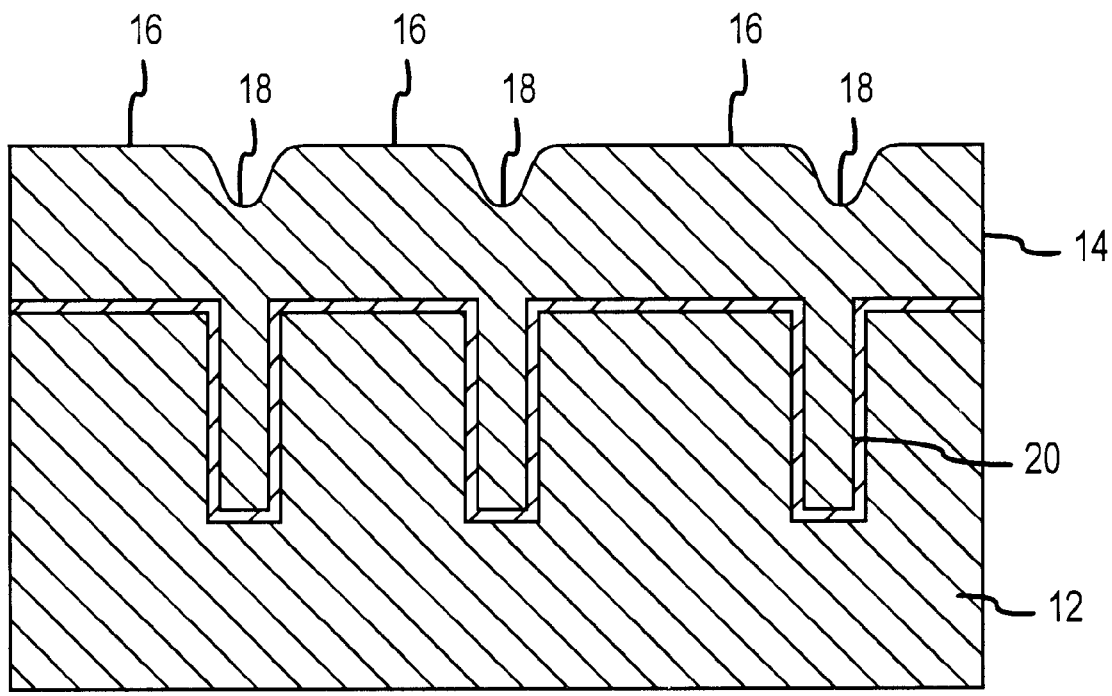
FIG. 2 is a cross-sectional view of a substrate with a metal layer.
Figure 3:
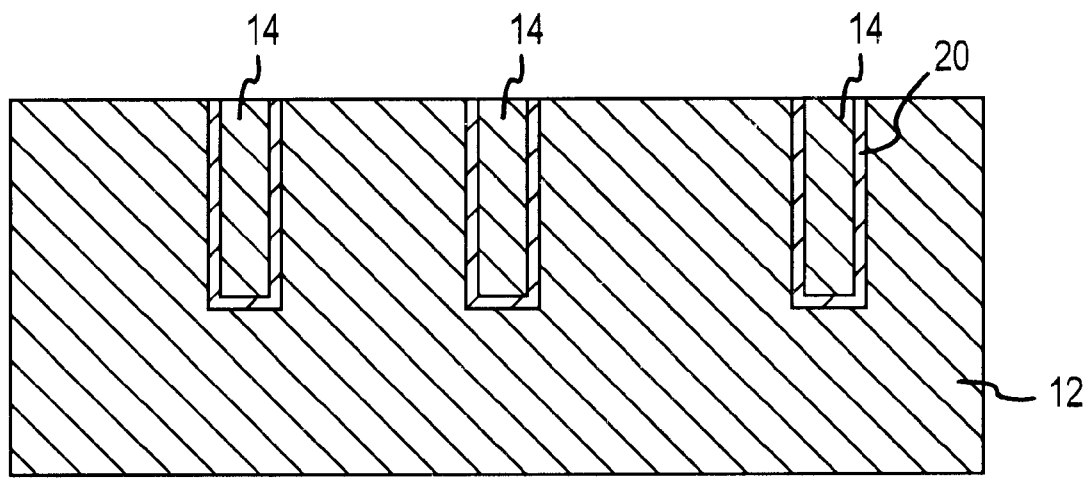
FIG. 3 is a cross-sectional view of a substrate with metal-filled trenches.

After planarization is completed, any remaining metal from the metallized surface and the remaining barrier layer 20, shown in FIG. 2, may be removed by standard etching processes, such as wet etch, vapor etch, spray etch, plasma or even CMP, since the surface of the wafer had just previously been substantially planarized with the present invention. Selection of the etch method and chemistry depends on the barrier layer chemistry.

An advantage of the ECP apparatus of the present invention is that, with concurrent electrochemical etching and chemical mechanical planarization, the metal layer is removed first from high topography areas, and subsequently uniformly planarized. The electrochemical etching aspect of the invention enables high removal rates at low pressures, which reduces dishing and oxide erosion. Another advantage is that, because a standard CMP apparatus may be retrofitted to perform ECP as described herein, specialized ECP machines do not need to be purchased and additional equipment costs are thereby reduced.

Figure 5:
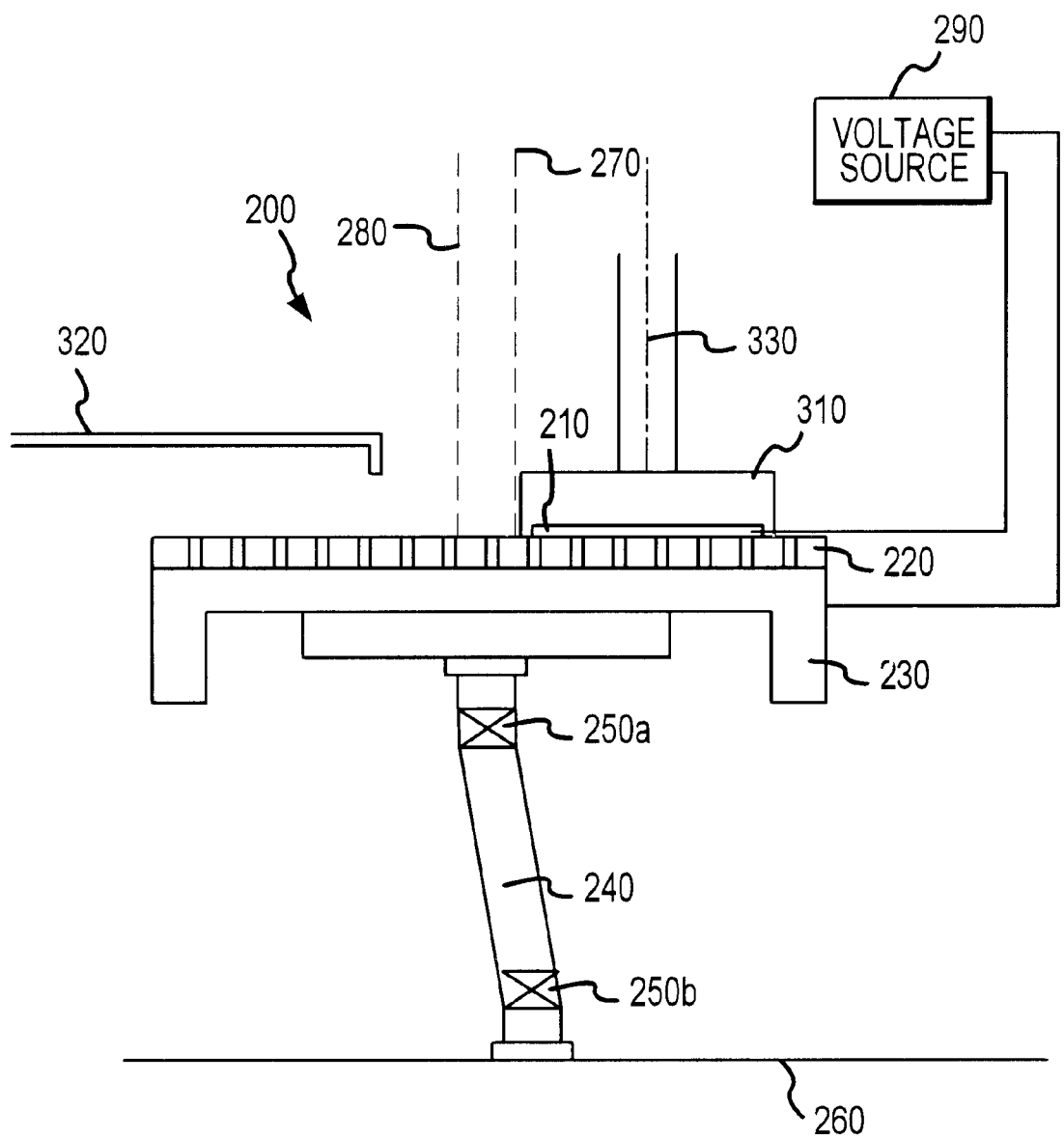
FIG. 5 is a schematic side view representation of another exemplary embodiment of an ECP apparatus of the present invention.

Referring to FIG. 5, an alternative embodiment 200 of the ECP apparatus of the present invention may use orbital motion of the polishing pad rather than rotational motion to planarize a wafer 210. According to this embodiment, a polishing pad 220 is fixedly attached to the upper surface of a conductive table 230. Table 230 may be made of metal, such as copper, or any other conductive material. A universal joint 240 having two pivoting points 250a and 250b is securely fastened to a stationary frame 260 and to the bottom surface of table 230. Universal joint 240 orbits table 230 and pad 220 about a fixed point 270 and prevents torque from rotating or spinning table 230. The dual pivot points 250a and 250b of universal joint 240 allow pad 220 to move in all directions except a rotational direction. The centers 280 of table 230 and pad 220 orbit clockwise about fixed point 270. The radius of the orbit is less than the radius of the wafer to be polished. The center of wafer 210 is offset from the center 280 of pad 220 and from the axis of orbit 270 and wafer 210 rotates counterclockwise about its center with a downward force. An example of polishing a wafer by orbital motion is disclosed more fully in U.S. Patent No. 5,554,064, issued Sep. 10, 1996 to Breivogel et al., which patent is incorporated herein by reference. It is to be appreciated that a variety of other well-known mechanisms may be employed to facilitate the orbital motion of the polishing pad in the present invention.

To effect electrochemical etching of the metallized surface of wafer 210, an electric potential difference is effected between the metallized surface of wafer 210 and conductive table 230 by a voltage source 290 which applies a positive charge to the surface of the wafer and a negative charge to conductive table 230. An electrolytic planarizing solution, which may include an electrolytic solution or an electrolytic solution combined with a conventional CMP slurry, may be applied by a conduit 320. Alternatively, it will be appreciated that the electrolytic planarizing solution may be supplied through conductive table 230 and polishing pad 220 through a manifold apparatus (not shown) or any suitable distribution device.

During ECMP processing using apparatus 200, wafer 210 is advanced toward polishing pad 220 by wafer carrier 310, which urges wafer 210 against polishing pad 220 with a desired force. Wafer carrier 310 spins about a vertical axis 330 while table 230 and pad 220 orbit about fixed point 270. An electrolytic planarizing solution is applied to polishing pad 220. As wafer 210 approaches conductive table 230, it is subjected to an electric field by the flow of current, which results in the release of metal ions from the metallized surface of wafer 210 upon contact with the electrolytic planarizing solution. As wafer 210 contacts polishing pad 220, it is further planarized by the abrasive action of polishing pad 220 and any abrasive particulates in the planarizing solution. The areas of high topography on the metallized surface of wafer 210 are removed, after which uniform etching and planarizing subsequently take place.

Figure 6:
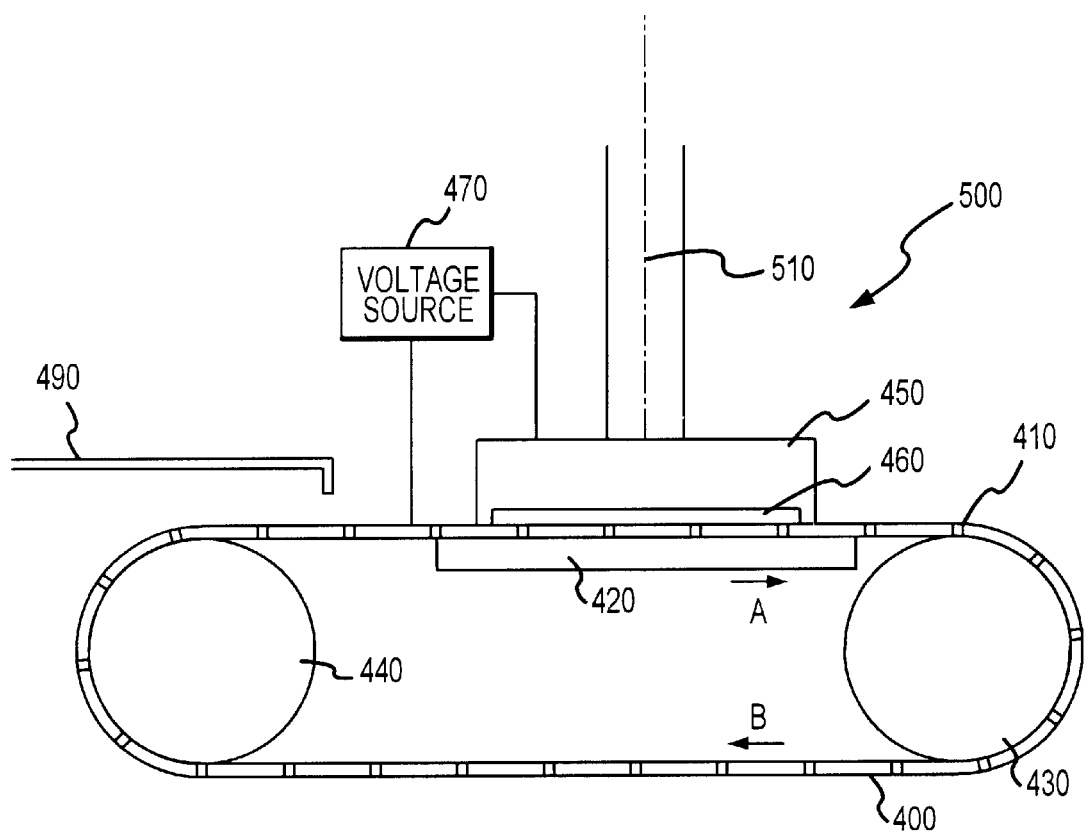
FIG. 6 is a schematic side view representation of yet another exemplary embodiment of an ECP apparatus of the present invention.

Referring to FIG. 6, an alternative embodiment 500 of the ECMP apparatus of the present invention uses an endless belt 400 having a perforated and/or porous polishing pad surface 410. Belt 400 may be made of metal or any other conductive material. For examples of endless belt polishers, see U.S. Pat. No. 5,692,947, issued Dec. 2, 1997 to Talieh, et al., and U.S. Pat. No. 5,722,877, issued Mar. 3, 1998 to Meyer et al., both patents which are incorporated herein by this reference. The belt 400 extends across a support plate 420 and is mounted to a pair of rollers 430 and 440. A motor or driver assembly (not shown) coupled to rollers 430 and 440 drives the rollers so that belt 400 is moved at a constant velocity in the direction indicated by arrows A and B. As the belt 400 is moved by the rollers, belt 400 travels across the support surface 420. The support surface 420 rigidly supports belt 400 opposite a wafer carrier 450 to ensure that the belt 400 applies a uniform polishing force across the entire surface of a wafer 460 having a metallized surface.

An electric potential is applied to the metallized surface of wafer 460 and belt 400 by a voltage source 470, which applies a positive charge to the surface of the wafer and a negative charge to belt 400. Voltage source 470 is shown in FIG. 6 as being directly connected to belt 400. However, it will be appreciated that any suitable mechanism for applying an electric potential to belt 400 may be used.

During ECP processing using apparatus 500, wafer 460 is advanced toward belt 400 by wafer carrier 450, which urges wafer 460 against polishing pad surface 410 of belt 400 with a desired force. Wafer carrier 450 spins about a vertical axis 510 while belt 400 advances around rollers 430 and 400. A planarizing solution, which may include an electrolytic solution or an electrolytic solution combined with a conventional CMP slurry, is applied to polishing pad surface 410. As wafer 460 approaches belt 400, it is subjected to an electric field by the flow of current, which results in the release of metal ions from the metallized surface of wafer 460. As wafer 460 contacts polishing pad surface 410, it is further planarized by the abrasive action of polishing pad 410 and any abrasive particulates in the planarizing solution. As a result, the areas of high topography on the metallized surface are removed, after which uniform etching and planarizing subsequently take place.

Although the subject invention has been described herein in conjunction with the appended drawing Figures, it will be appreciated that the scope of the invention is not so limited. Various modifications in the arrangement of the components discussed and the steps described herein for using the subject device may be made without departing from the spirit and scope of the invention as set forth in the appended claims.

We claim:

1. An electrochemical planarization apparatus for planarizing a metallized surface on a workpiece, said apparatus comprising:

(a) a platen;

(b) a conductive element disposed adjacent said platen;

(c) a polishing surface disposed adjacent said conductive element;

(d) a workpiece carrier configured to carry a workpiece and press said workpiece against said polishing surface while causing relative motion between said workpiece and said polishing surface;
(e) a voltage source configured to effect an electric potential difference between said metallized surface of said workpiece and said conductive element; and
(f) a solution application mechanism configured to supply an electrolytic solution to said polishing surface.

2. The apparatus of claim 1, wherein said polishing surface is perforated.

3. The apparatus of claim 1, wherein said polishing surface is porous.

4. The apparatus of claim 1, wherein said relative motion is chosen from the group consisting of: linear motion, orbital motion, circular motion, a combination of linear and orbital motion, a combination of linear and circular motion, a combination of orbital motion and circular motion, and a combination of linear, orbital and circular motion.

5. The apparatus of claim 1, wherein said metallized surface is of a material selected from the group consisting of: Cu, Cu/Al, Ni, Ag, Au, Ta, TaN, Ti, TiN, W, CoWP, NiP, and CoP.

6. The apparatus of claim 1, wherein said conductive element is integral with said platen.

7. A method of planarizing a metallized surface on a workpiece, the method comprising:
(a) providing a platen;
(b) providing a conductive element on a surface of said platen;
(c) providing a polishing surface on a surface of said conductive element;
(d) providing a workpiece carrier configured to carry a workpiece;
(e) pressing said workpiece against said polishing surface while causing relative motion between said workpiece and said polishing surface;
(f) establishing an electric potential difference between said metallized surface on said workpiece and said conductive element; and
(g) supplying an electrolytic solution at said polishing surface.

8. The method of claim 7, wherein said relative motion is chosen from the group consisting of: linear motion, orbital motion, circular motion, a combination of linear and orbital motion, a combination of linear and circular motion, a combination of orbital motion and circular motion, and a combination of linear, orbital and circular motion.

9. The method of claim 7, wherein said conductive element is integral with said platen.

10. The method of claim 7, wherein said polishing surface is perforated.

11. The method of claim 7, wherein said polishing surface is porous.

12. An electrochemical planarization apparatus for planarizing a copper layer on a workpiece, the apparatus comprising:
(a) a platen;
(b) a conductive element disposed adjacent said platen;
(c) a polishing surface disposed adjacent said conductive element;
(d) a workpiece carrier configured to carry a workpiece and press said workpiece against said polishing surface while causing relative motion between said workpiece and said polishing surface;
(e) a voltage source configured to effect an electric potential difference between said copper layer and said conductive element;
(f) an electrolytic solution source; and
(g) a solution application mechanism configured to supply an electrolytic solution from said electrolytic solution source to said polishing surface.

13. The apparatus of claim 12, wherein said polishing surface is perforated.

14. The apparatus of claim 12, wherein said polishing surface is porous.

15. The apparatus of claim 12, wherein said relative motion is chosen from the group consisting of: linear motion, orbital motion, circular motion, a combination of linear and orbital motion, a combination of linear and circular motion, a combination of orbital motion and circular motion, and a combination of linear, orbital and circular motion.

16. The apparatus of claim 12, wherein said conductive element is integral with said platen.

17. An electrochemcial planarization apparatus for planarizing a metallized surface on a workpiece, said apparatus comprising:
(a) a linear polishing assembly having a polishing member configured to move in a linear direction;
(b) a conductive element disposed proximate said polishing member;
(c) a polishing surface disposed proximate said polishing member and configured to move linearly with said polishing member;
(d) a workpiece carrier configured to carry a workpiece and press said workpiece against said polishing surface while causing relative motion between said workpiece and said polishing surface;
(e) a voltage source configured to effect an electric potential difference between a metallized surface of said workpiece and said conductive element; and
(f) a solution application mechanism configured to supply an electrolytic solution to said polishing surface.

18. The apparatus of claim 17 wherein said conductive element is integral with said polishing member and is configured to move linearly with said polishing member.

19. The apparatus of claim 17, wherein said polishing surface is perforated.

20. The apparatus of claim 17, wherein said polishing surface is porous.

21. The apparatus of claim 17, wherein said relative motion is chosen from the group consisting of: linear motion, orbital motion, circular motion, a combination of linear and orbital motion, a combination of linear and circular motion, a combination of orbital motion and circular motion, and a combination of linear, orbital and circular motion.

22. The apparatus of claim 17, wherein said metallized surface is of a material selected from the group consisting of: Cu, Cu/Al, Ni, Ag, Au, Ta, TaN, Ti, TiN, W, CoWP, NiP, and CoP.

23. A method of planarizing a metallized surface on a workpiece, the method comprising:
(a) providing a linear polishing assembly having a polishing member configured to move in a linear direction;
(b) providing a conductive element disposed proximate said polishing member;
(c) providing a polishing surface proximate to said polishing member and configured to move linearly with said polishing member;
(d) providing a workpiece carrier configured to carry a workpiece;

(e) pressing said workpiece against said polishing surface while causing relative motion between said workpiece and said polishing surface;

(f) establishing an electric potential difference between said metallized surface on said workpiece and said conductive element; and (g) supplying an electrolytic solution at said polishing surface.

24. The method of claim 23, wherein said conductive element is integral with said polishing member and is configured to move linearly with said polishing member.

25. The method of claim 23, wherein said polishing surface is perforated.

26. The method of claim 23, wherein said polishing surface is porous.

27. The method of claim 23, wherein said relative motion is chosen from the group consisting of: linear motion, orbital motion, circular motion, a combination of linear and orbital motion, a combination of linear and circular motion, a combination of orbital and circular motion, and a combination of linear, orbital and circular motion.

* * * * *